United States Patent
Kvatinsky et al.

(10) Patent No.: US 12,425,018 B2
(45) Date of Patent: Sep. 23, 2025

(54) APPARATUS AND METHOD FOR ULTRA-FAST CRYSTALLIZATION IN PHASE-CHANGE RF SWITCHES

(71) Applicant: Technion Research & Development Foundation Limited, Haifa (IL)

(72) Inventors: Shahar Kvatinsky, Haifa (IL); Nicolas Wainstein, Haifa (IL); Eilam Yalon, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 14 days.

(21) Appl. No.: 18/276,267

(22) PCT Filed: Feb. 15, 2022

(86) PCT No.: PCT/IL2022/050180
§ 371 (c)(1),
(2) Date: Aug. 8, 2023

(87) PCT Pub. No.: WO2022/172277
PCT Pub. Date: Aug. 18, 2022

(65) Prior Publication Data
US 2024/0313766 A1    Sep. 19, 2024

Related U.S. Application Data

(60) Provisional application No. 63/149,418, filed on Feb. 15, 2021.

(51) Int. Cl.
*H10N 70/20*   (2023.01)
*H03K 3/01*    (2006.01)
*H03K 17/51*   (2006.01)

(52) U.S. Cl.
CPC ............ *H03K 17/51* (2013.01); *H03K 3/01* (2013.01)

(58) Field of Classification Search
CPC .......... H01P 1/10; H03K 17/00; H03K 17/04; H03K 17/041; H03K 17/51; H01N 70/00;
(Continued)

(56) References Cited

U.S. PATENT DOCUMENTS 11,942,929 B2 * 3/2024 Dykstra ................. H03K 17/56

FOREIGN PATENT DOCUMENTS

WO    WO 2022/172277    8/2022

OTHER PUBLICATIONS

International Search Report and the Written Opinion Dated May 9, 2022 From the International Searching Authority Re. Application No. PCT/IL2022/050180. (10 Pages).
(Continued)

*Primary Examiner* — Hai L Nguyen (57) ABSTRACT

An indirectly heated phase change switch (IPCS) for radio frequency (RF) switching, comprises two RF ports and an RF path therebetween, a phase change material (PCM) located between the RF ports, an embedded heater separated from the PCM by a dielectric layer, the embedded heater configured to provide thermal actuation of the PCM to bring about phase changes between a crystalline state and an amorphous state to provide Ohmic switching, and a bias voltage on the IPCS across said RF path. The bias is provided during heating to improve the crystallization time.

19 Claims, 9 Drawing Sheets

(58) Field of Classification Search
CPC .... H01N 70/20; H01N 70/231; H01N 70/841; H01N 70/8413; H01N 70/8613; H10N 70/00; H10N 70/20; H10N 70/231; H10N 70/841; H10N 70/8413; H10N 70/8613
USPC .............................. 327/108, 365, 373, 374
See application file for complete search history.

(56) References Cited

OTHER PUBLICATIONS

Wainstein et al. "Indirectly Heated Switch as a Platform for Nanosecond Probing of Phase Transition Properties in Chalcogenides", IEEE Transactions on Electron Devices, 68(3): 1298-1303, Jan. 14, 2021.

Yalon et al. "Energy-Efficient Indirectly Heated Phase Change RF Switch", IEEE Electron Device Letters, 40(3): 455-458, Feb. 1, 2019.

\* cited by examiner

APPARATUS AND METHOD FOR ULTRA-FAST CRYSTALLIZATION IN PHASE-CHANGE RF SWITCHES

RELATED APPLICATIONS

This application is a National Phase of PCT Patent Application No. PCT/IL2022/050180 having International filing date of Feb. 15, 2022, which claims the benefit of priority under 35 USC § 119 (e) of U.S. Provisional Patent Application No. 63/149,418 filed on Feb. 15, 2021. The contents of the above applications are all incorporated by reference as if fully set forth herein in their entirety.

FIELD AND BACKGROUND OF THE INVENTION

The present invention, in some embodiments thereof, relates to a method for ultra-fast crystallization in phase-change RF switches and, more particularly, but not exclusively, to the use of such a method for ultra-fast switching.

Reconfigurable RF integrated circuits (RFIC) are an attractive feature to sustain the always-increasing performance demand of modern mobile devices as the hardware can be adapted to fulfill the diverse requirements of wireless communication standards. Reconfigurable RFICs allow for redundant hardware removal, which results in smaller area, lower complexity, and reduction in the number of modules in radio chips. In these systems, the RF switch is an essential component, controlling the flow of the RF signal and providing tunable capabilities to different blocks. In this connection, indirectly heated phase change switches (IPCS) may provide a candidate for reconfigurable RF applications, but its crystallization time hinders its use in high-speed applications.

Four-terminal, inline, indirectly heated phase-change switches (IPCS) have recently emerged as contenders for 5G, mmWave and reconfigurable radiofrequency (RF) circuits, owing to their excellent transmission properties, non-volatility, small footprint, high switching endurance and CMOS compatibility. These devices exhibit order-of-magnitude better cutoff frequency over standard semiconductor technologies. The IPCS consists of a phase-change material (PCM) connected inline by two RF ports. The PCM is thermally activated from beneath by an embedded heater, which is isolated from the PCM by a dielectric material. As in two-terminal, directly heated phase-change memory, the set (OFF to ON) operation requires longer switching time than the reset operation (ON to OFF) since it is limited by the crystallization time of the PCM. In the IPCS, the crystallization time is typically 1 µs. Furthermore, the switching requires large energy consumption.

More particularly, FOUR-TERMINAL, inline, indirectly heated phase change switches (IPCS) have recently emerged as high-performance switches for radio frequency (RF) applications, owing to their high cutoff frequency in which $$(fco = (2\pi R_{ON} C_{OFF})^{-1}),$$

which provides a figure-of-merit (FOM) in RF switches. The IPCS is an ohmic switch, where the resistance varies thanks to the large resistance ratio between the amorphous (high-resistivity) and the crystalline (low-resistivity) phase.

The IPCS consists of two RF ports in-line with the PCM, separated by a small gap, and two terminals for thermal actuation using an embedded microheater. The microheater runs transversely to the direction of the PCM contacts, under the PCM and electrically isolated by a dielectric. For high performance RF applications, high switching speed is required, besides a high fCO. Unfortunately, the switching speed of the IPCS is limited by the crystallization time of the PCM (typically Germanium Telluride-GeTe). Generally, the set (crystallization) time is 1 µs, almost ten times (10×) larger than the reset (amorphization) time, which is usually between 100-200 ns.

SUMMARY OF THE INVENTION

Embodiments of the present invention may improve the switching time in applications of the IPCS such as, but not restricted to, single-pole, multiple-throw switches, switch matrices, tunable/adaptive devices (inductors, capacitors), filter switching, etc.

The present embodiments may provide a crystallization time enhancement method by using a bias voltage across the RF path. Embodiments may set switching times below 50 ns for an IPCS which uses GeTe as the PCM. The crystallization of the PCM is reduced thanks to field-induced nucleation, which boosts up the crystallization time. Furthermore, we show that the switching energy is considerably reduced (1 µJ to <100 nJ). The present method may be used in RF applications of the IPCS as it does not require any extra circuitry.

According to an aspect of some embodiments of the present invention there is provided an indirectly heated phase change switch (IPCS) for radio frequency (RF) switching, the IPCS comprising:
first and second RF ports, the ports defining an RF path therebetween;
a phase change material (PCM) located between first and second RF ports;
an embedded heater separated from the PCM by a dielectric layer, the embedded heater configured to provide thermal actuation of the PCM to bring about phase changes between a crystalline state and an amorphous state to provide Ohmic switching between a first resistance level in the crystalline state and a second resistance level in the amorphous state; and
connections for a bias voltage on the IPCS across the RF path.

The IPCS may be configured such that the bias voltage is provided for a duration of a heating pulse applied to the embedded heater.

The PCM may have a melting point, and the heating pulse is a relatively large amplitude pulse to raise the temperature of the PCM beyond the melting point, the bias voltage thereby providing quenching to crystalize to a low resistance state.

Alternatively, the heating pulse is of an amplitude insufficient to cause melting of the PCM, the bias voltage thereby accelerating crystallization due to a field dependency of a crystallization time.

In embodiments, the IPCM comprises Germanium Telluride (GeTe).

Embodiments may comprise a pulse generator circuit in parallel to the RF path, and may provide readout of a switch resistivity in order to ascertain that the necessary transition has indeed occurred.

The IPCS may comprise one or more DC biasing circuit elements.

The IPCS may use the readout to monitor for device performance and device wear.

The IPCS may be used as an attenuator with multiple analog values, and the readout may carry out read and verify.

The IPCS may for example be useful as a single pole switch, a multiple throw switch, a switch matrix, a tunable device, an adaptive device and a filter switching device.

According to a second aspect of the present invention there is provided a method of switching an indirectly heated phase change switch (IPCS) for radio frequency (RF) switching, the method comprising:
  applying a bias voltage across the IPCS;
  applying a heating pulse to a heater located adjacent a phase change material (PCM); and
  via the heating pulse and under the bias voltage, causing the heater to provide thermal actuation of the PCM to bring about phase changes between a crystalline state and an amorphous state to provide Ohmic switching between a first resistance level in the crystalline state and a second resistance level in the amorphous state The method may comprise providing the bias voltage for a duration of the heating pulse.

The PCM has a melting point, and in embodiments, the heating pulse is a relatively large amplitude pulse to raise the temperature of the PCM beyond the melting point, the bias voltage thereby providing quenching to crystalize to a low resistance state.

Alternatively, the heating pulse is of an amplitude insufficient to cause melting of the PCM, the bias voltage thereby accelerating crystallization due to a field dependency of a crystallization time.

The method may comprise using a pulse width for the heating pulse which is greater than a crystallization time of the PCM, thereby to achieve volatile switching of the PCM.

Alternatively, raising and lowering the voltage bias may be used to alternate between volatile and non-volatile switching.

Volatile switching may be advantageously used for R.F. burst transmissions.

In an embodiment, the PCM comprises GeTe having a melt resistance $R_{melt}$ lower than a crystallization resistance, $R_{cryst}$, the method comprising using the bias voltage to electrically heat an RF path through the PCM while the PCM is in a low transient resistance, thereby preventing a fast quench, and thus leaving the PCM crystallized. In such a case, hot programming may be carried out, meaning carrying out the Ohmic switching while an RF signal is applied to the RF path through the PCM.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to a method for ultra-fast crystallization in phase-change RF switches and, more particularly, but not exclusively, to the use of such a method for ultra-fast switching.

An indirectly heated phase change switch (IPCS) for radio frequency (RF) switching, comprises two RF ports and an RF path therebetween, a phase change material (PCM) located between the RF ports, an embedded heater separated from the PCM by a dielectric layer, the embedded heater configured to provide thermal actuation of the PCM to bring about phase changes between a crystalline state and an amorphous state to provide Ohmic switching, and a bias voltage on the IPCS across said RF path. The bias is provided during heating to improve the crystallization time.

The present embodiments may improve the crystallization time (set) of the PCM in RF switches, enabling faster and more energy-efficient switching. The present embodiments may use a simple and cheap mechanism and may exploit the fundamental field-controlled growth of the PCM to improve the switching speed without the need for any change in the device structure. The proposed mechanism may be built upon existing radio transceivers. The embodiment may allow for fast switching of the phase-change RF switch, and may use reduced switching energy. There is no requirement for existing phase-change RF switches, and phase-change switches may stand as a promising candidate for high-performance applications. The switches themselves are in production at least at one renowned semiconductor fabricant. The programming mechanism is compatible with existing radio transceivers, and extra circuitry may be added to implement the programming mechanism. The extra circuitry may be used to keep track of the device performance, wear and if the device is used as an attenuator with multiple analog values, to implement the read & verify programming scheme.

As mentioned, the crystallization time in conventional four-terminal, indirectly heated phase-change switches (IPCS) is a major limitation, and is typically larger than the amorphization time (1 μs and 100 ns, respectively). The present embodiments may reduce the crystallization time in the IPCS to below 50 ns. In the present method, a small bias voltage is applied to the PCM terminals while the heating pulse (e.g., programming pulse) is applied to the microheater. More particularly, the present methods may reduce the set time in the IPCS below 150 ns for the nonvolatile set and below 50 ns for volatile set. In the present embodiments, a small bias voltage may be applied to the phase-change material (PCM) terminals while the heating pulse (i.e., programming pulse) is applied to the microheater. One method uses field-induced growth and set-like pulses, that is medium amplitude pulses, while the other method uses high-amplitude pulses and takes advantage of the low resistance of the PCM when melted and slowed quenching time. Thanks to these methods, the set energy is reduced by around four times. A yet further method uses resetlike pulses and takes advantage of the low resistance of the PCM when melted. With these methods, the crystallization energy may also be reduced from 1 μJ to <100 nJ.

Figure 2A:
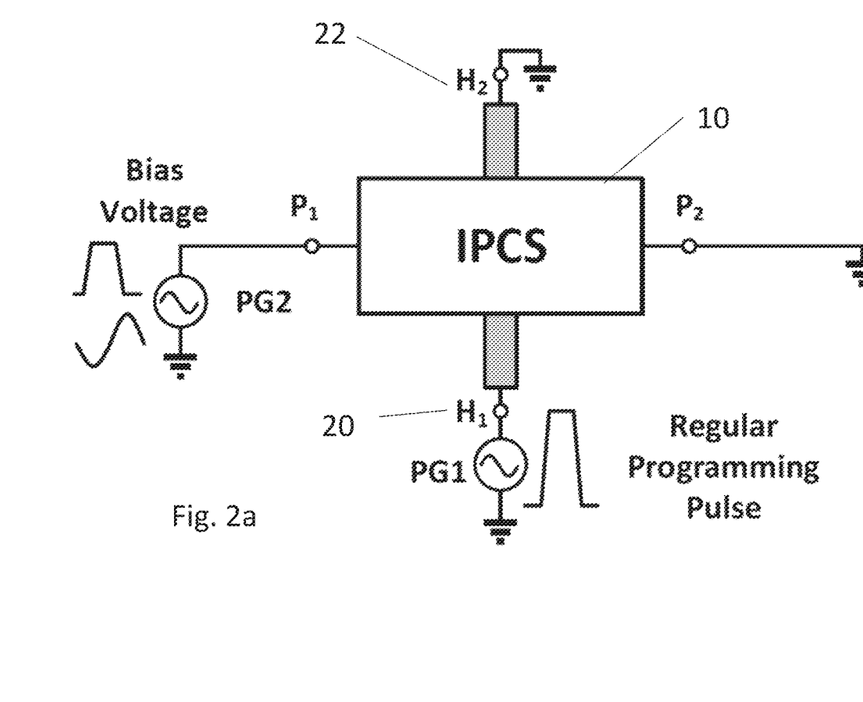
FIGS. 2a and 2b are a) a simplified block diagram of a circuit schematic and b) a pulse diagram of a programming method for enhanced crystallization with bias voltage, according to embodiments of the present invention.
Figure 2B:
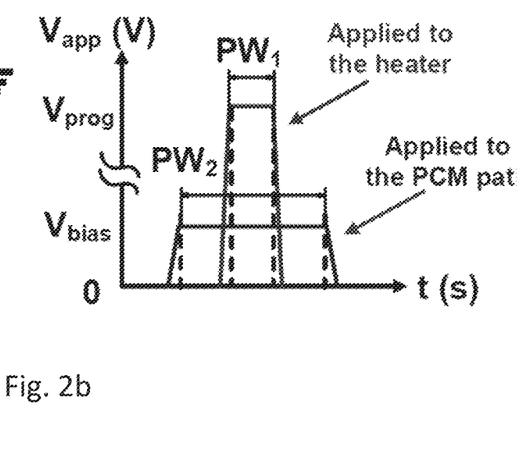

An embodiment may reduce the set (crystallization) time by using a bias voltage through the RF path (PCM electrodes). A bias voltage is applied to the RF path (PCM electrodes) for the duration of the heating pulse through the heater as shown in FIGS. 2(a) and 2(b) discussed below. The method may be implemented with two mechanisms:

a. Large amplitude pulses (originally used for amorphization) that raise the temperature of the PCM beyond its melting temperature. The resistance at the melting point is lower than the crystallization temperature. In this case the bias voltages prevent fast quenching (cooling), thus crystallizing the device to its low resistance state.

b. Medium amplitude pulses (similar to those used for crystallization). The bias voltage accelerates the crystallization process owing to the field-dependency of the crystallization time.

The bias voltage may be a either a rectangular pulse (constant field), a low frequency sinusoidal signal (RF signal), or a sinusoidal signal with offset.

A programming mechanism may be provided that is compatible with existing radio transceivers without any modifications, and this is discussed in FIG. 3(a) below.

If extra circuitry is used to implement the programming method, for example by providing a pulse generator circuit in parallel to the RF path, then the method may further be used to read out the resistance of the switch. The extra circuitry requires DC biasing circuit elements such as an RF choke as shown in FIG. 4(b).

The readout circuit may be used to keep track of the device performance, wear and if the device is used as an attenuator with multiple analog values, to implement the read & verify programming scheme, as discussed hereinbelow with reference to FIG. 5.

The method may also be compatible with applications of the IPCS such as, but not restricted to, single-pole, multiple-throw switches, switch matrices, tunable/adaptive devices (e.g., inductors, capacitors), filter switching, etc.

The present embodiments further include two set time enhancement methods which use a bias voltage (Vbias) across the RF path simultaneously with the heating pulse.

The first method exploits the field-induced crystallization and the dependence of the Ovonic threshold switching (OTS) phenomena with temperature by using medium amplitude pulses. Variations in the pulse-width (PW) determine whether the set is volatile or non-volatile.

The second method uses high-amplitude pulses and takes advantage of the low resistance of the PCM when melted combined with an intentionally slow quenching time by direct electrical heating of the PCM. Here, the PCM bias amplitude determines whether the set is volatile or not. We report nonvolatile set switching times below 150 ns and volatile switching times below 50 ns for our prototype IPCS which uses GeTe as the PCM. This results in an improvement in the set time of 10 times compared with typical values and an improvement of 4 times compared with the shortest set times reported to date. As stated above, we show that the switching energy is reduced, again by around four times. This second method may be used in RF applications of the IPCS as it does not require any extra circuitry.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figures 1A, 1C:
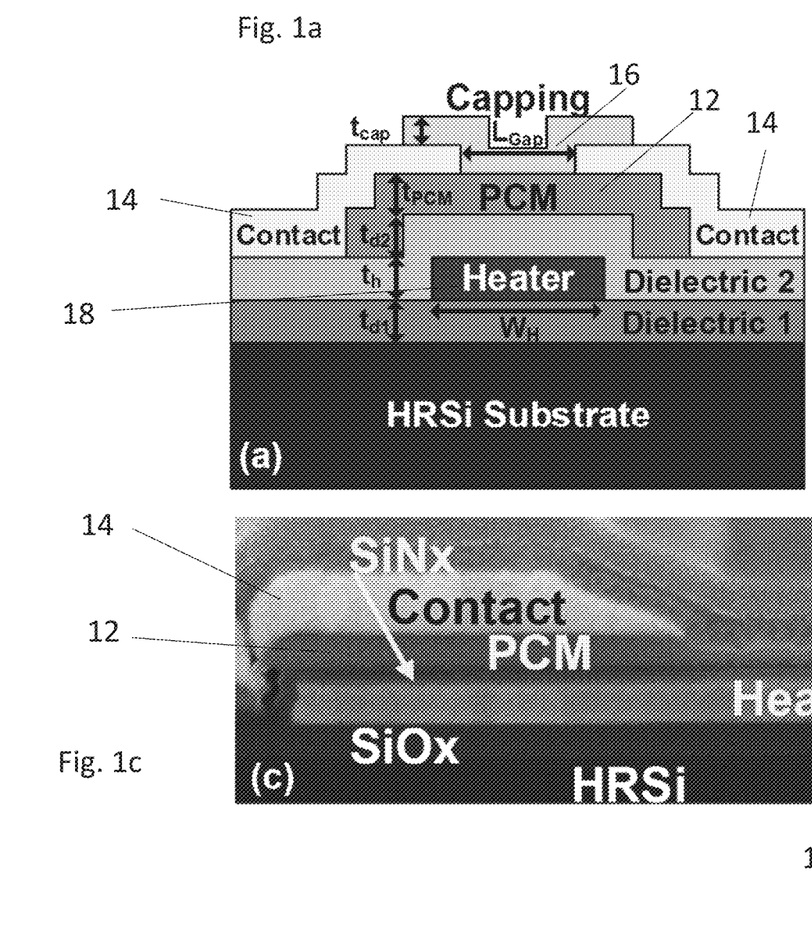
FIGS. 1a-1c are three simplified views of Fabricated IPCS for use in the present embodiments, including (a) a schematic cross-section, (b) a top-view optical micrograph, in which a PCM is connected in-line by two RF electrodes of width WRF, separated by a small gap of length LRF, the PCM layer being thermally activated from beneath by a heater of width WH and length LH, and (c) a SEM cross-section.
Figure 1B:
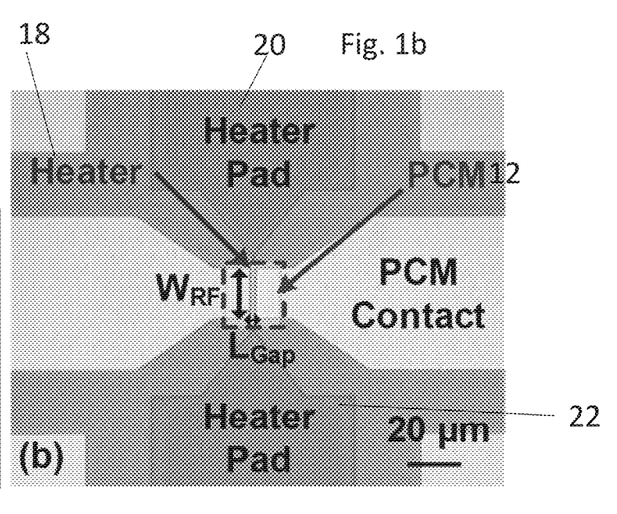
Figure 1D:
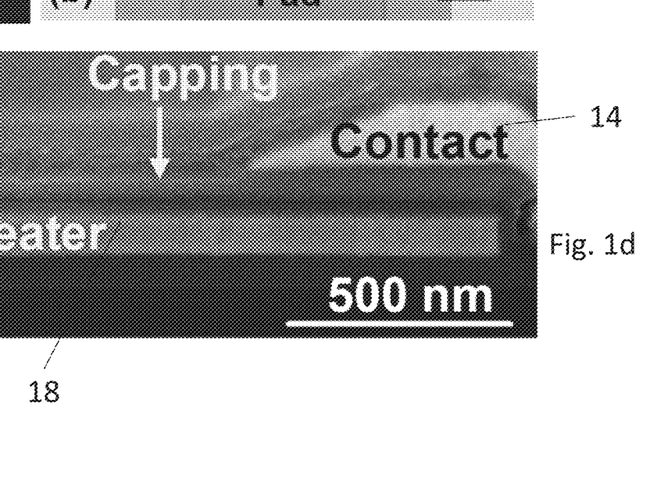

Referring now to the drawings, FIG. 1(a) illustrates a schematic cross-sectional view of an IPCS 10 according to the present embodiments. FIG. 1(b) is an optical view of the same, and FIG. 1 (c) illustrates a scanning electron microscope (SEM) cross-section of the IPCS. An 80-nm GeTe layer 12 is connected in-line by two RF electrodes 14 of width WRF, separated by a small gap of length LRF indicated by arrow 16. The GeTe layer is thermally activated from beneath by a heater 18 of width WH and length LH.

The IPCS devices are fabricated over high-resistivity Si wafers ($\rho$>10 k·cm). First, a 100-nm SiO2 is thermally grown, then Ti/TiN/W (5/30/110 nm) heaters are sputtered by DC magnetron sputtering. The heaters are dry-etched using reactive-ion etch (RIE). A 40 nm Si3N4 insulating layer is then deposited using plasma-enhanced chemical vapor deposition (PECVD). Then, an 80-nm GeTe layer is sputtered and heated in-situ up to 200° C. for 15 minutes.

The GeTe layer is patterned with RIE and then a pre-metallization surface treatment is performed with descum and deionized water.

Ti/Au (20/200 nm) contacts are e-beam evaporated. After contact deposition, a 100-nm SiO2 layer is sputtered to passivate the GeTe. Vias are opened to the heaters and to the PCM electrodes.

FIGS. 2a and 2b are a) a simplified block diagram of a circuit schematic and b) a pulse diagram of a programming method for enhanced crystallization with bias voltage, according to embodiments of the present invention. A measurement setup consists of a Keysight B1500A with high-voltage semiconductor pulse generator units (SPGU) with 50 output resistance and a Keysight high-speed oscilloscope.

Two heater pads 20 and 22, are associated with the heaters 18. IPCS 10 is connected with a voltage PG1 across the heater pads 20 and 22. A varying bias voltage is then connected across ports P1 and P2. More particularly, in the measurement setup the pads may be probed with ground-signal (GS) RF probes, connected in parallel to the SPGU1 and channel 1 (CH1) of the scope, which is set to high-Z (1 M) input. Port P1 is connected to the SPGU2 and port P2 of the IPCS is connected in series to the second channel (CH2) of the scope, which is set to 50 input resistance.

To probe the resistance of the PCM, a small amplitude, large width pulse is applied as PG1 to the RF pads while PG2 is the programming pulse that is applied to the heater. The resistance change of the PCM is determined from the measured voltage at CH2 ($V_{CH2}$), corresponding to the voltage drop on the 50 input resistances.

The resistance is thus, $$R_{IPCS} = 2Z_0\left(\frac{V_{PG2}}{V_{CH2}} - 1\right) - R_S$$

where $V_{PG2}$ is the voltage applied by the SPGU2 to a 50 load, and Rs is the leads resistance of the PCM pads.

The heater temperature ($T_H$) rises owing to joule heating while the programming pulse is applied. As $T_H$ rises, the resistance of the heater ($R_H$) increases according to its temperature coefficient of resistance (TCR).

Thus, the temperature variation of the heater ($\Delta T_H$) may be determined as $$\Delta T_H(t) = \Delta R_H(t)/(R_{HRT} TCR),$$

where $R_{HRT}$ is the resistance of the heater at room temperature (RT). The TCR of the heater is determined using a transfer length method (TLM) structure of the heater with widths WH=2 μm and 4 μm and lengths LH from 5 to 30 μm at varying temperatures (from RT to 400° C.) using a Linkam thermal stage. The TCR is expected to be constant over the temperature range.

The present embodiments may thus implement a set scheme where a medium range bias voltage is applied to the RF path while the set pulse is applied. In this case, the voltage is high enough to partially contribute to the heating of the PCM, but below the threshold voltage (approx. 5 V). As a result, the switch is able to crystallize with narrower pulses (<200 ns), this being less than half of the pulse width required with indirect heating.

FIG. 2(b) illustrates the two pulses PW1 applied to the heater and PW2 applied across the PCM as a programming scheme.

Figures 3A, 3B, 3C, 3D:
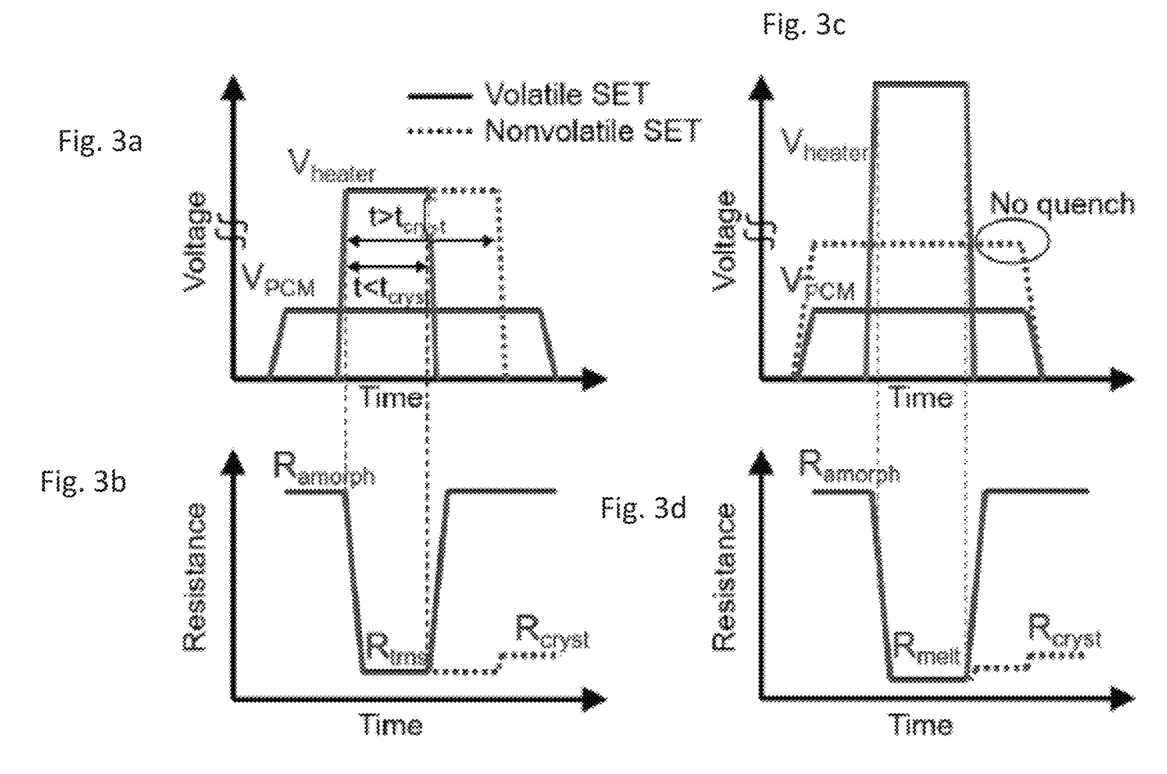
FIGS. 3a to 3d are four pulse diagrams of programming schemes for enhanced crystallization with bias voltage, according to embodiments of the present invention.

Reference is now made to FIGS. 3(a) to 3(d) which respectively illustrate enhanced set programming schemes. FIGS. 3(a) and 3(b) show pulse schemes and resistance variation for field-enhanced crystallization exploiting the reduction of $V_{th}$ at high temperatures with varying heating PW. The dashed lines indicate a non-volatile set of results which occur when PW>$t_{cryst}$, and volatile OTS is observed otherwise.

FIGS. 3(c) and 3(d) show pulse schemes and resistance variation for enhanced set time exploiting the low resistance at the melting temperature with varying PW. The non-volatile set of results, again shown in dashed lines, occurs whenever the $V_{bias}$ is sufficiently high to reduce the quenching time that will otherwise reamorphize the PCM.

Figure 4A:
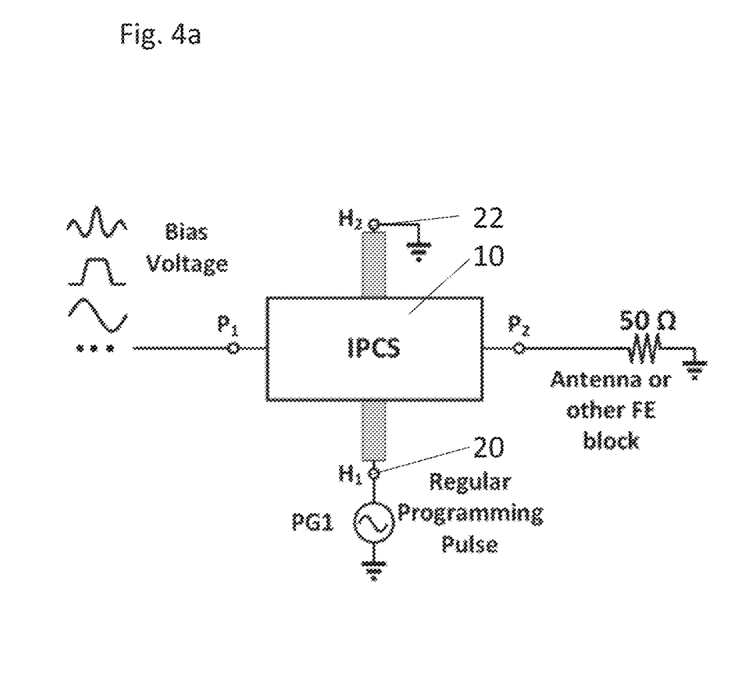
FIGS. 4a and 4b are two simplified diagrams illustrating circuitry for implementation of a programming method according to the present embodiments in an RF front-end, in which the PCM path (RF Path) is connected to the front-end with (FIG. 4b) or without (FIG. 4a) auxiliary coupling/decoupling circuit elements such as inductors, or capacitors, and wherein a bias signal is generated by the RF front-end itself or by auxiliary circuitry.
Figure 4B:
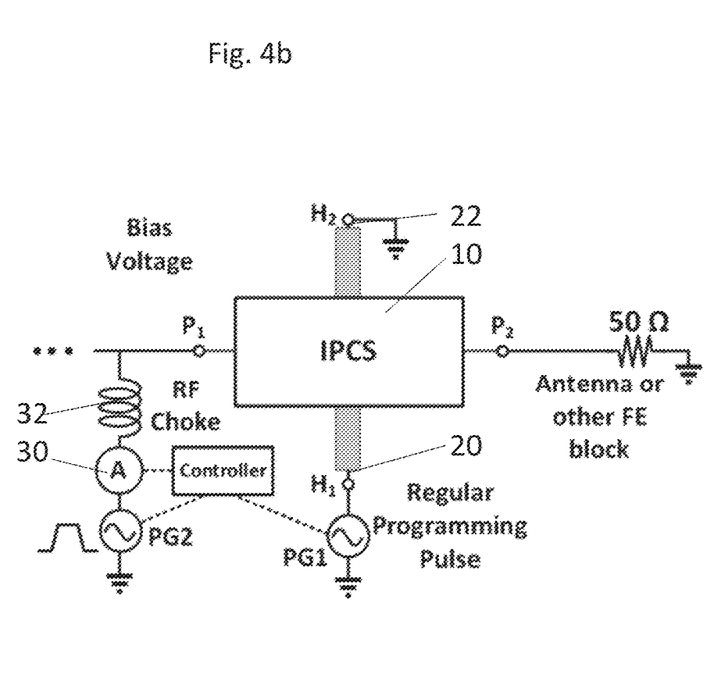

Reference is now made to FIGS. 4(a) and 4(b), which are simplified diagrams illustrating circuitry for implementation of a programming method according to the present embodiments in an RF front-end, in which the PCM path (RF Path) is connected to the front-end with—FIG. 4(b) or without-FIG. 4(a), auxiliary coupling/decoupling circuit elements such as inductors, or capacitors, and wherein a bias signal is generated by the RF front-end itself or by auxiliary circuitry. More particularly, IPCS 10 is connected as in FIG. 2(a). Two heater pads 20 and 22, are associated with the heaters 18. IPCS 10 is connected with a voltage PG1 across the heater pads 20 and 22. A varying bias voltage is then connected across ports P1 and P2. An antenna block 30 is connected to the port P2. PG1 is a regular programming pulse. In FIG. 4(a) the bias voltage is connected directly to P1. In FIG. 4(b) the bias voltage PG2 is connected via a controller 32 and a coil, RF choke 34.

Figure 5:
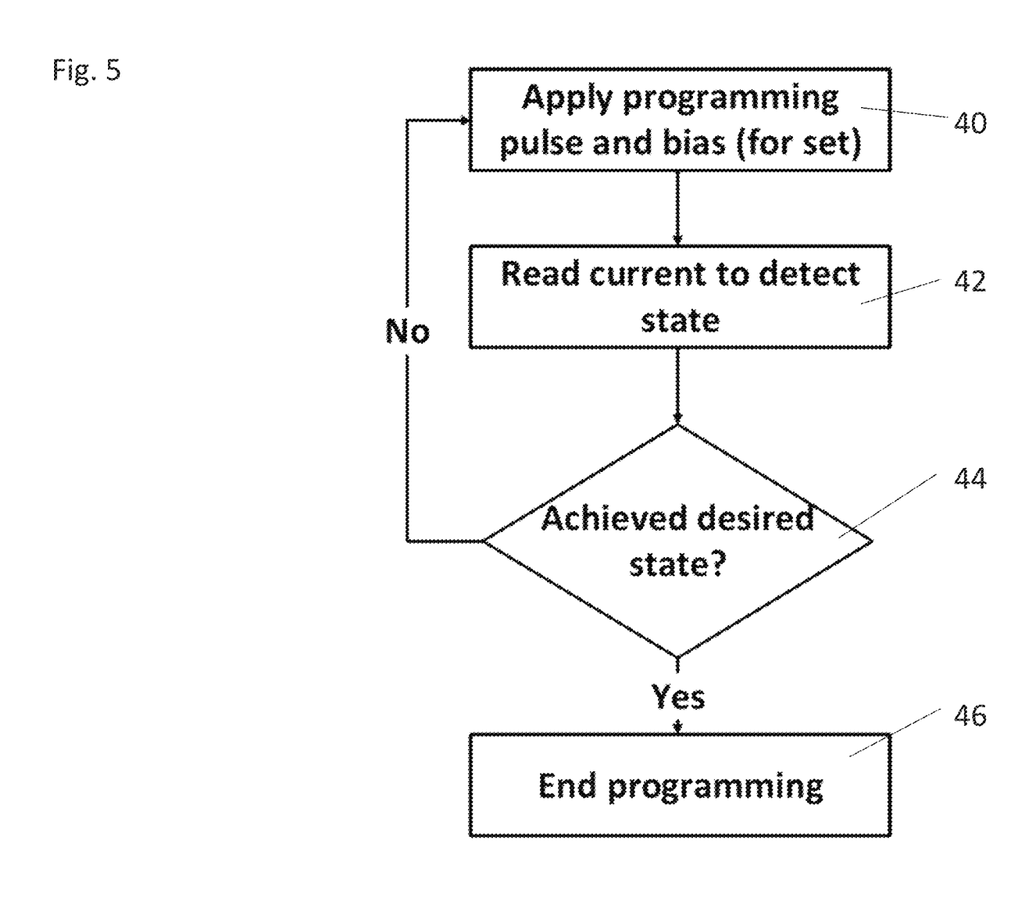
FIG. 5 is a simplified flow chart illustrating an algorithm for write and verify for IPCS using a programming method according to the present embodiments.

FIG. 5 is a simplified flow chart illustrating an algorithm for write and verify for IPCS using a programming method according to the present embodiments. In box 40, a programming pulse and bias is applied to set the desired state. In box 42 the current is read to determine whether the desired state has been achieved. In box 44 the determination is queried and if the desired state is found to have been achieved then the procedure ends in box 46. Otherwise the procedure returns to box 40.

Figure 6A:
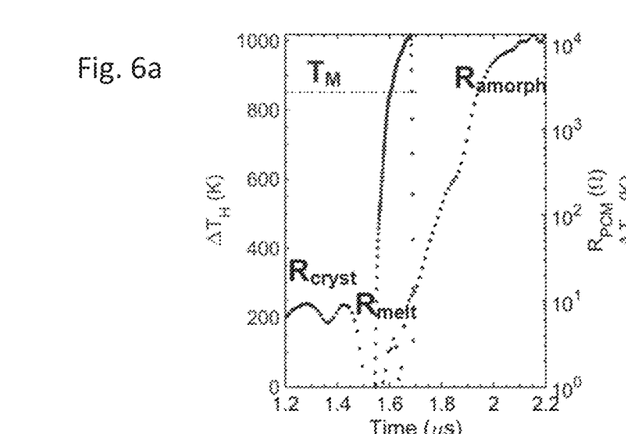
FIGS. 6a-6d are a series of graphs illustrating temperature v. resistance in use of the present embodiments, thus (a) Amorphization process, (b) Crystallization process with 400-ns-wide and 6.5-V-high pulses, in which the crystallization process continues after the programming pulse goes to 0 V as the quenching time is at least 200 ns. (c) fast crystallization using 0.5 V bias voltage and 150-ns-wide, 7-V-high heating pulse, and (d) fast crystallization using 0.75 V bias voltage and 100-ns-wide and 8-V-high heating pulse.
Figure 6B:
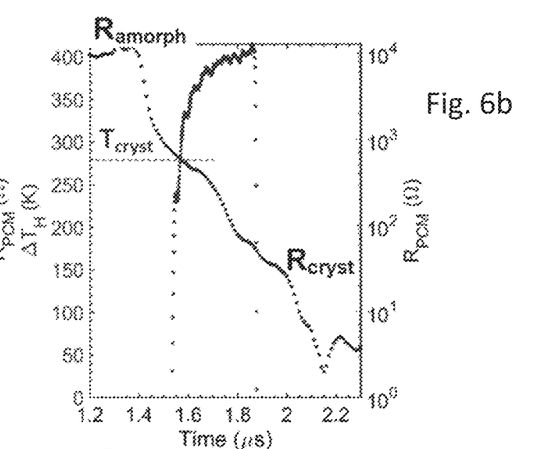
Figure 6C:
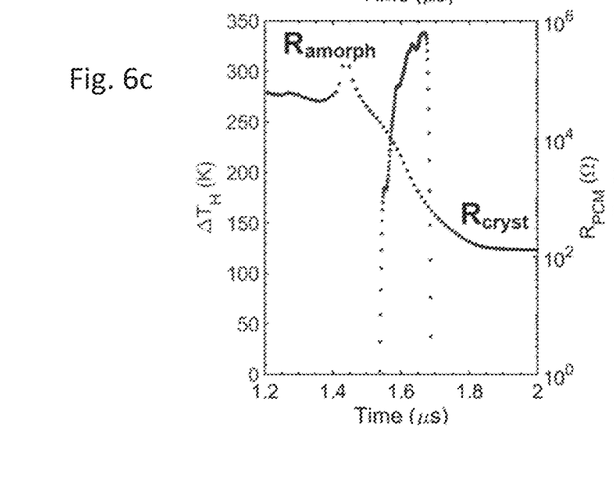
Figure 6D:
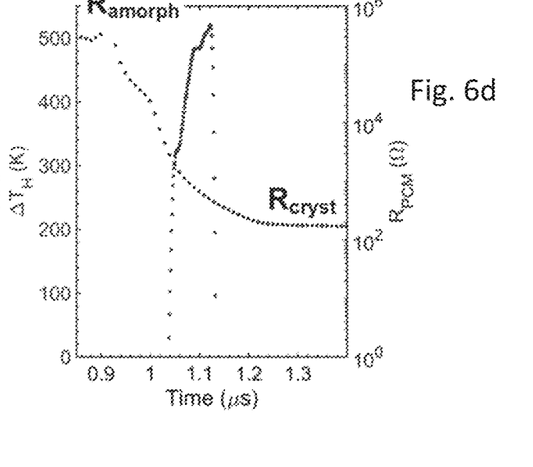
Figure 7A:
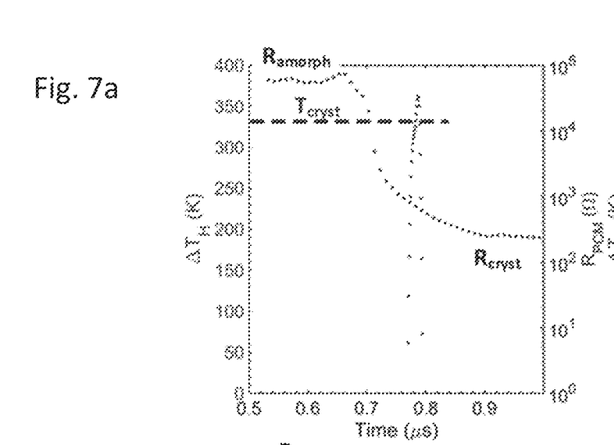
FIGS. 7a-7d are a further series of graphs of Temperature versus Resistance in the present embodiments, in which crystallization is shown in a 20-μm switch using a 7-V/50-ns pulse with (a) 0.5 V and (b) 0.75 V bias voltage, and fast crystallization is shown in a 30-μm switch using (c) an 8-V/150-ns pulse and (d) a 12-V/150-ns pulse, wherein both cases use a 0.75 V bias voltage.
Figure 7B:
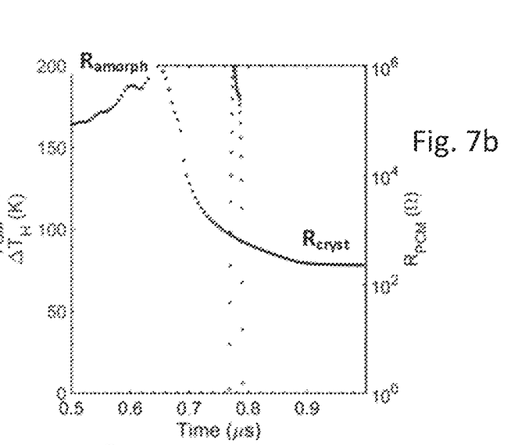
Figure 7C:
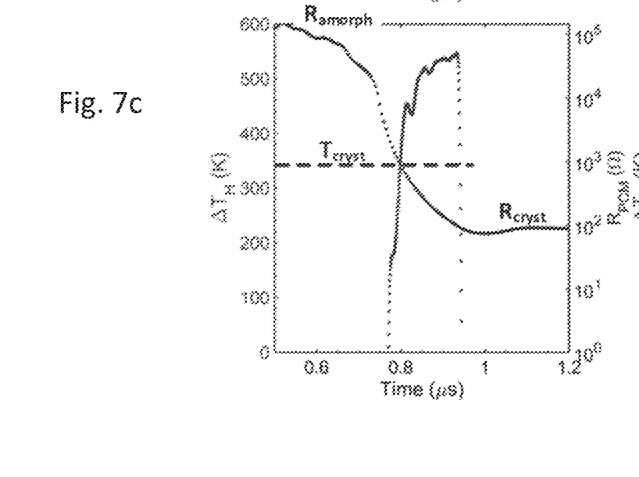
Figure 7D:
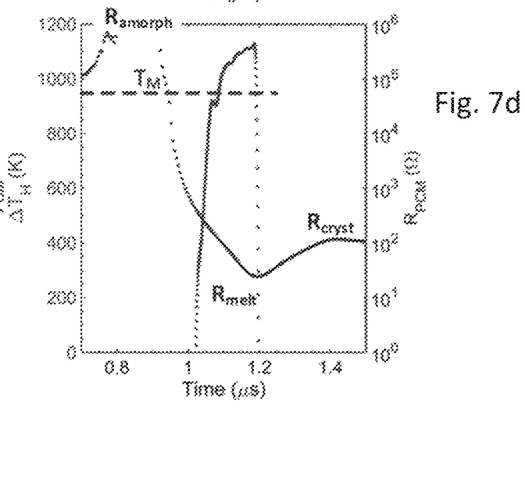

The biasing schemes of the present embodiments may be used in IPCS applications to boost the crystallization time. Devices are in LRS as-deposited, though the crystalline resistance ($R_{cryst}$) may vary between samples. A reset operation is shown in FIG. 6(a). As the PCM achieves the melting point (after a heating time, $t_{heat}$ of approximately 150 ns), the resistance reduces below the initial $R_{cryst}$ to the resistance of melted GeTe (Rmelt). An IPCS according to the present embodiments may be set without bias voltage within 400 ns as shown in FIG. 6(b). FIG. 6(c) shows a set operation while applying 0.5 V and through the RF path and 7-V-high and 200-ns-wide pulse through the heater. Similarly, crystallization with bias voltage of 0.75 V and a heating pulse of 150 ns and 8 V is shown in FIG. 6(d). This way, the set is triggered by heat and not by the Ovonic threshold phenomena. As the resistance decreases, the direct-heating power increases, and the resistance decreases even further.

In terms of switching energy, the presently described methodology is preferred over the nominal indirect heating because of the direct heating of the PCM, which is more energy-efficient. Here, the crystallization is a result of a mixed direct-indirect heating.

For the cases presented in FIGS. 6(c-d), the switching energy is 195 nJ and 180 nJ, respectively. Conversely, a 400 ns set operation requires approximately 400 nJ. The present scheme may thus not be applicable for reset since such direct heating would prevent correct amorphization.

Further improvements of the set time are shown in FIG. 7(a-b), where a 20-μm-wide switch is set with 7-V/50-ns pulses using 0.5 V and 0.75 V bias voltage, respectively. It may be observed that although the final resistance is lower for the
0.75 V, the difference is negligible. The same programming scheme is used in a 30-μm-wide switch with 8-V/150-ns pulses and a 0.75 V as shown in FIG. 7(c).

A different approach to reduce the set time is to take advantage of the low $R_{melt}$ of the GeTe. The $R_{melt}$ in this case is usually lower than $R_{cryst}$. The bias pulse may be used to prevent the fast quench, thus crystallizing the PCM. Therefore, the presently described alternative method may be used with 'hot-switching', i.e., programming the device while an RF signal is applied to the PCM path. To prevent wear-out of the switch, the RF signal may be kept at low voltage levels. This fast crystallization method is shown for a 30-μm-wide switch using a 150-ns 'reset' pulse 12-V-high in FIG. 6(d). The ΔTH rises above $T_M$ and thus the resistance drops to $R_{melt}$. Because of the bias voltage, the resistance remains at LRS instead of rising to HRS as in regular reset operations.

The crystallization energy using the present method may be reduced to 140 nJ, 3.5× lower than the set energy required with 400 ns pulses, and almost 10× lower than the energy using 1 μs pulses.

Figure 8A:
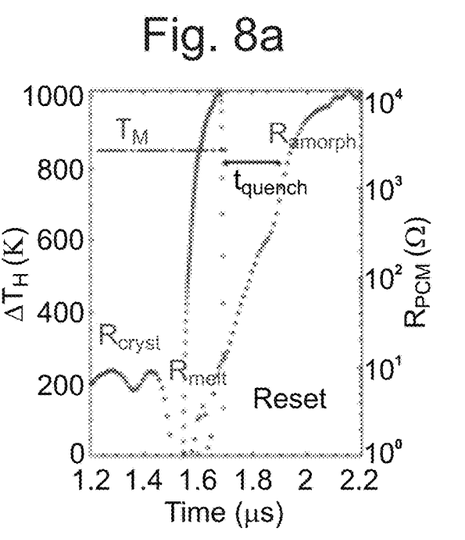
FIGS. 8a-8d are a further series of graphs showing switching characteristics of an IPCS according to embodiments of the present invention.
Figure 8B:
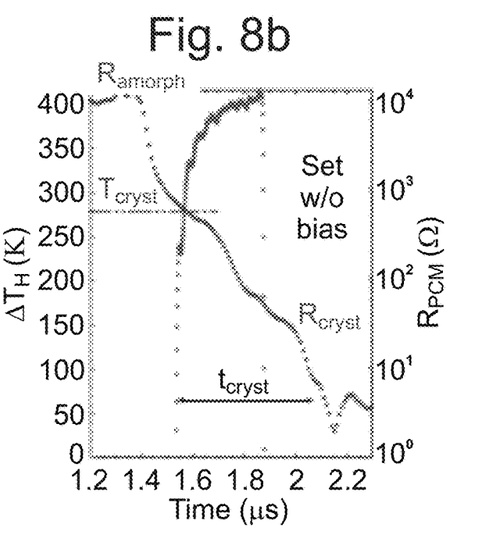
Figure 8C:
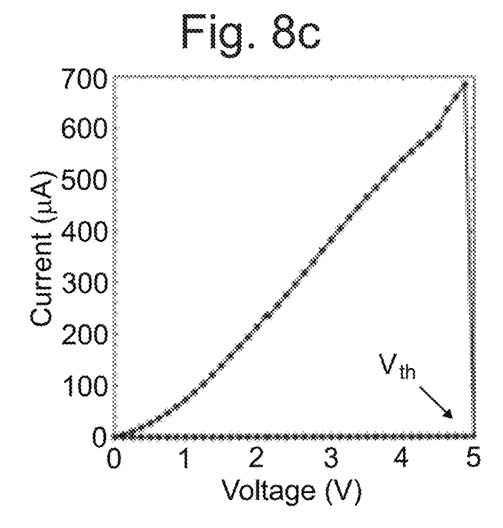
Figure 8D:
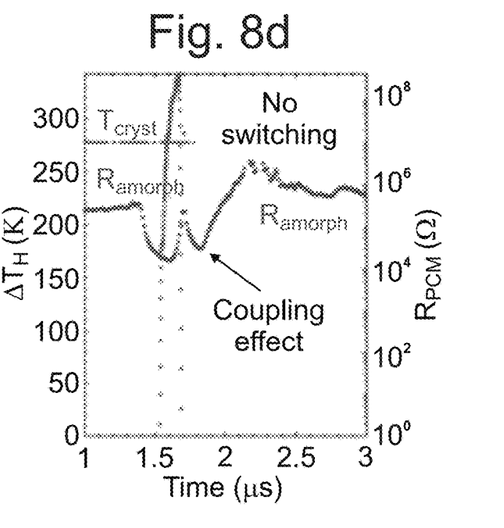

Reference is now made to FIGS. 8(a) to 8(d) which further illustrate switching characteristics of the IPCS according to embodiments of the present invention. FIG. 8A=(a) shows temperature and resistance variation of the amorphization using a 10.5 V/180 ns pulse. FIG. 8(b) shows crystallization using a 6.5 V/400 ns pulse. It is noted that the crystallization process continues after the programming pulse goes to 0 V as the quenching time is at least 200 ns. FIG. 8(c) shows the I-V curve of a typical $V_{th}$. FIG. 8(d) shows an unsuccessful set operation with a 200 ns pulse provided without bias. Set pulses shorter than 400 ns do not crystallize the devices in the absence of a $V_{bias}$.

Figure 9A:
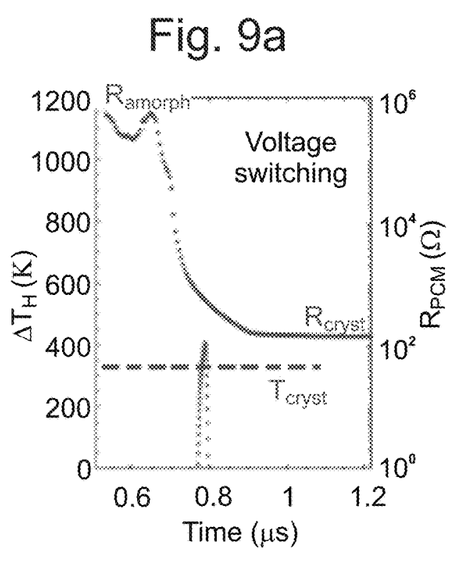
FIGS. 9a-9d are a series of graphs showing volatile and non-volatile switching.
Figure 9B:
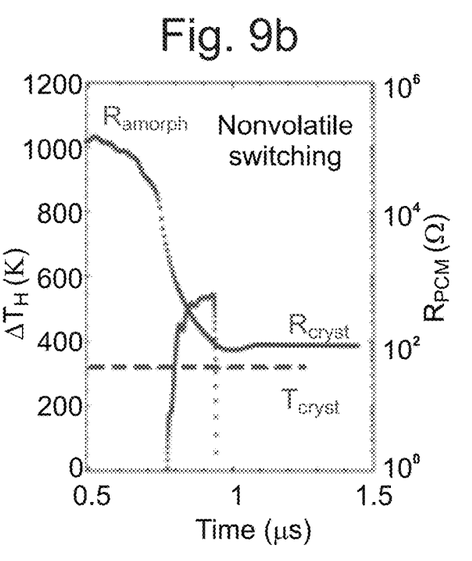
Figure 9C:
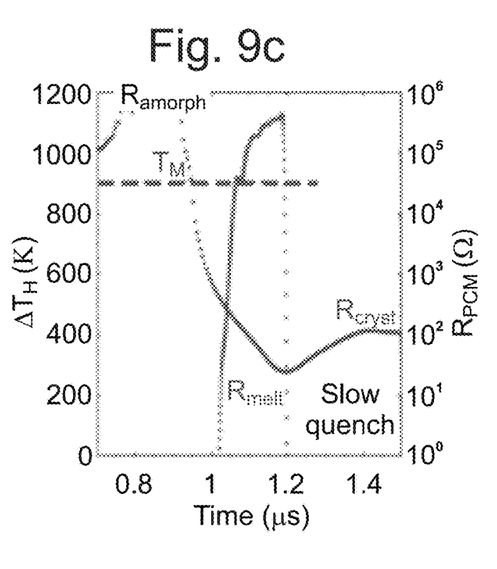
Figure 9D:
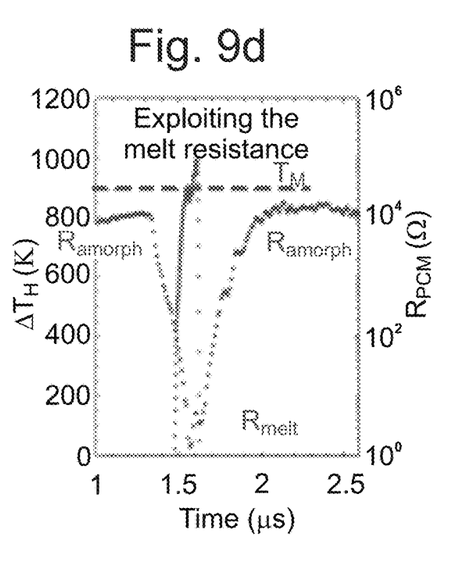

Reference is now made to FIGS. 9(a) to 9(d), which illustrate volatile and nonvolatile switching. FIG. 9 (a) shows a volatile set operation using a 7 V/50 ns pulse with 0.75 V bias. FIG. 9(b) shows a nonvolatile set operation using 8 V/120 ns at 0.5 V bias. FIG. 9(c) illustrates a nonvolatile set operation involving slow quenching after achieving melting resistance using a high-amplitude pulse of 150 ns and 0.75 V bias. FIG. 9(d) shows a volatile set operation within 100 ns for burst transmission exploiting low $R_{melt}$.

More particularly, since threshold voltage in PCM decreases as temperature rises, lower $V_{bias}$ at the PCM can trigger the OTS phenomenon. This can be achieved in the IPCS by applying the heating pulse to the embedded microheater. This behavior is depicted in FIG. 9(a), which shows a volatile set operation while applying $V_{bias}$=0.75 V on the PCM and a 7 V/50 ns heating pulse. Conversely, a nonvolatile set operation is observed with $V_{bias}$=0.5 V on the PCM and a 8 V/120 ns heating pulse.

Therefore, it can be inferred that the set is triggered by heat and assisted by the OTS phenomenon. The crystallization is reinforced by the small electric field which induces thermal prestructural ordering (field-induced crystallization). As the resistance decreases, the direct-heating power increases, reducing the resistance even further. The achieved resistive state is not the lowest possible RON since as RIPCS reduces, most of the Vbias is dropped on the serial 50 output resistance of the PGU and 50 input resistance of the scope.

As above, a different approach to reduce the set time is to take advantage of the low $R_{melt}$ of the GeTe. This $R_{melt}$ is usually lower than $R_{cryst}$. The PCM bias can be used to electrically heat the channel while it is in a low transient resistance, and this heating is sufficient to prevent the fast quench, thus the PCM is crystallized. Therefore, this method can be used with 'hot-switching', i.e., programming the device while an RF signal is applied to the PCM path. To prevent wear-out of the switch, the RF signal may be kept at low voltage levels. This fast crystallization method is shown using a 150-ns high-amplitude pulse in FIG. 4(c). The $_\Delta$TH rises above $T_M$ and thus the resistance drops to $R_{melt}$. Because of the $V_{bias}$, the resistance remains low. Volatile switching with a high-amplitude pulse and without bias is shown in FIG. 9(d), as discussed above.

Though the volatile set is not the regular operation of the IPCS, the volatile set could be used in RF applications for burst transmission. In terms of switching energy, this methodology is preferred over the nominal indirect heating because of the field enhancement and direct heating of the PCM, which is more energy-efficient. Hence, the crystallization is a result of mixed direct-indirect heating.

For the cases presented in FIGS. 9(b-c), the switching energy is 255 nJ and 263 nJ, respectively. These values include the direct heating energy (2% of the total consumed energy). Conversely, a 400 ns set operation requires approximately 510 nJ. Thus, the set method according to the present embodiments may reduce by half the set energy required with 400 ns pulses, and by almost times compared to the energy required with 1 μs pulses.

The present embodiments may thus reduce the crystallization time in IPCS. By applying a bias voltage to the PCM path, the crystallization time is improved using two different physical phenomena:
  a) field-induced crystal growth and
  b) low resistance when melted and decelerated quenching time.

Electrical thermometry of the heater and the transient resistance readout may serve as tools to confirm that the crystallization is achieved by the proposed physical mechanisms. Crystallization times below 50 ns are achieved, reducing considerably the switching energy of these devices. An advantage of these methods is that they are compatible with standard radio transceivers or require very few modifications of such standard radio transceivers.

In this disclosure, the terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment and the present description is to be construed as if such embodiments are explicitly set forth herein. Conversely, various features of the invention, which are, for brevity, described in the context of a single embodiment, may also be provided separately or in any suitable subcombination or may be suitable as a modification for any other described embodiment of the invention and the present description is to be construed as if such separate embodiments, subcombinations and modified embodiments are explicitly set forth herein. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An indirectly heated phase change switch (IPCS) for radio frequency (RF) switching, the IPCS comprising:
    first and second RF ports, said ports defining an RF path therebetween;
    a phase change material (PCM) located between first and second RF ports;
    an embedded heater separated from said PCM by a dielectric layer, the embedded heater configured to provide thermal actuation of said PCM to bring about phase changes between a crystalline state and an amorphous state to provide Ohmic switching between a first resistance level in said crystalline state and a second resistance level in said amorphous state; and
    connections for a bias voltage on said IPCS across said RF path.

2. The IPCS of claim 1, configured such that said bias voltage is provided for a duration of a heating pulse applied to said embedded heater.

3. The IPCS of claim 1, the PCM having a melting point, and wherein said heating pulse is a relatively large amplitude pulse to raise the temperature of the PCM beyond said melting point, said bias voltage thereby providing quenching to crystalize to a low resistance state.

4. The IPCS of claim 1, the PCM having a melting point, and wherein said heating pulse is of an amplitude insufficient to cause melting of said PCM, said bias voltage thereby accelerating crystallization due to a field dependency of a crystallization time.

5. The IPCS of claim 1, wherein said IPCM comprises Germanium Telluride (GeTe).

6. The IPCS of claim 1, further comprising a pulse generator circuit in parallel to said RF path, and a readout circuit configured to provide a readout of a switch resistivity.

7. The IPCS of claim 6, further comprising at least one DC biasing circuit element.

8. The IPCS of claim 6, configured to use said readout circuit to monitor at least one member of the group consisting of: device performance and device wear.

9. The IPCS of claim 6, configured for use as an attenuator with multiple analog values, said readout circuit carrying out read and verify.

10. The IPCS of claim 1, configured for use as one member of the group consisting of: a single pole switch, a multiple throw switch, a switch matrix, a tunable device, an adaptive device and a filter switching device.

11. A method of switching an indirectly heated phase change switch (IPCS) for radio frequency (RF) switching, the method comprising:
    applying a bias voltage across said IPCS;
    applying a heating pulse to a heater located adjacent a phase change material (PCM); and
    via said heating pulse and under said bias voltage, causing said heater to provide thermal actuation of said PCM to bring about phase changes between a crystalline state and an amorphous state to provide Ohmic switching between a first resistance level in said crystalline state and a second resistance level in said amorphous state.

12. The method of claim 11, comprising providing said bias voltage for a duration of said heating pulse.

13. The method of claim 11, the PCM having a melting point, and wherein said heating pulse is a relatively large amplitude pulse to raise the temperature of the PCM beyond said melting point, said bias voltage thereby providing quenching to crystalize to a low resistance state.

14. The method of claim 11, the PCM having a melting point, and wherein said heating pulse is of an amplitude insufficient to cause melting of said PCM, said bias voltage thereby accelerating crystallization due to a field dependency of a crystallization time.

15. The method of claim 11, wherein said heating pulse has a pulse width, the pulse width selected to be greater than a crystallization time of said PCM, thereby to achieve volatile switching of said PCM.

16. The method of claim 11, comprising raising and lowering said voltage bias to alternate between volatile and non-volatile switching.

17. The method of claim 11, comprising using said volatile switching for R.F. burst transmissions.

18. The method of claim 11, wherein said PCM comprises GeTe having a melt resistance $R_{melt}$ lower than a crystallization resistance, $R_{cryst}$, the method comprising using said bias voltage to electrically heat an RF path through said PCM while said PCM is in a low transient resistance, thereby preventing a fast quench, and thus leaving the PCM crystallized.

19. The method of claim 18, comprising carrying out said Ohmic switching while an RF signal is applied to said RF path through said PCM.

* * * * *